(12) United States Patent
Bergström

(10) Patent No.: US 7,096,571 B2
(45) Date of Patent: Aug. 29, 2006

(54) METHOD FOR TRANSFERRING COMPONENT TAPE INFORMATION TO A COMPONENT MOUNTING MACHINE AND MEANS THEREFORE

(75) Inventor: Johan Bergström, Bromma (SE)

(73) Assignee: Mydata Automation AB, Bromma (SE)

( * ) Notice: Subject to any disclaimer, the term of this patent is extended or adjusted under 35 U.S.C. 154(b) by 209 days.

(21) Appl. No.: 10/652,237

(22) Filed: Sep. 2, 2003

(65) Prior Publication Data

US 2004/0149383 A1    Aug. 5, 2004

Related U.S. Application Data

(62) Division of application No. 09/886,384, filed on Jun. 22, 2001, now Pat. No. 6,631,870.

(30) Foreign Application Priority Data

Dec. 22, 1998  (SE) .................... 9804495
Mar. 23, 1999  (SE) .................... 9901057

(51) Int. Cl.
*H01R 43/00* (2006.01)
(52) U.S. Cl. .................... 29/739; 29/740; 29/742; 29/743
(58) Field of Classification Search ............. 29/739, 29/740, 742, 743
See application file for complete search history.

(56) References Cited

U.S. PATENT DOCUMENTS

| | | | |
|---|---|---|---|
| 4,819,699 A | 4/1989 | Brown et al. | |
| 4,820,369 A | 4/1989 | Kubo | |
| 5,053,103 A | 10/1991 | Fritsch | |
| 5,268,059 A | 12/1993 | Olson | |
| 5,299,902 A * | 4/1994 | Fujiwara et al. ....... | 414/416.01 |
| 5,515,600 A | 5/1996 | Iwasaki et al. | |
| 5,553,376 A * | 9/1996 | Solanki et al. ................ | 29/833 |
| 5,713,125 A * | 2/1998 | Watanabe et al. ............. | 29/833 |
| 5,725,140 A | 3/1998 | Weber et al. | |
| 6,162,007 A | 12/2000 | Witte | |
| 6,402,452 B1 | 6/2002 | Miller et al. | |

(Continued)

FOREIGN PATENT DOCUMENTS

DE    32 14 600 A1    10/1983

(Continued)

OTHER PUBLICATIONS

Copy of brochure of Europlacer Industries, Jan. 7, 1994.

(Continued)

*Primary Examiner*—David P. Bryant
*Assistant Examiner*—Christopher K. Agrawal
(74) *Attorney, Agent, or Firm*—Birch, Stewart, Kolasch & Birch, LLP

(57) ABSTRACT

A method of transferring component tape information to a component mounting machine, a tape guide for guiding a component tape in a component mounting machine, and a tape magazine for receiving the tape guide. The tape guide is arranged for quick and ready attachment and detachment into and from the component mounting machine. The loading and/or unloading of a component tape into and from the tape guide can be performed away from the component mounting machine. The ability to be releasably mounted is achieved by providing the tape guide with a lock that enables ready and quick attachment and detachment to an interacting lock in a component mounting machine, or in a tape magazine arranged for insertion into a component mounting machine, and a guide for guiding the component tape. The tape guide further includes an identifier for holding the identity of the tape guide, which can be associated with information relating to the component tape.

54 Claims, 4 Drawing Sheets

U.S. PATENT DOCUMENTS 6,619,526 B1 9/2003 Souder, Jr.
6,779,726 B1 * 8/2004 Easton ................. 235/462.01

FOREIGN PATENT DOCUMENTS

| EP | 0 876 091 | 11/1998 |
| EP | 0 914 034 | 5/1999 |
| EP | 0 967 849 | 12/1999 |
| EP | 0 973 369 | 1/2000 |
| GB | 2317496 | 9/1996 |
| JP | 02-077200 | 3/1990 |
| JP | 2274000 A | 11/1990 |
| JP | 4 171 894 | 6/1992 |
| JP | 4189433 | 7/1992 |
| JP | 5 116 836 | 5/1993 |
| JP | 6232591 | 8/1994 |
| WO | WO 86/00778 | 1/1986 |
| WO | WO 01/81220 | 11/2001 |

OTHER PUBLICATIONS

"Smart Feeders Prevent Placement Errors" by Robert J. Black, Jr., from Circuits Manufacturing, Jan. 1990 pp. 66-67.
Copy of homepage printout from Europlace, "Programmable Tape Trolley," date unknown.

* cited by examiner

METHOD FOR TRANSFERRING COMPONENT TAPE INFORMATION TO A COMPONENT MOUNTING MACHINE AND MEANS THEREFORE

This application is a Divisional of application Ser. No. 09/886,384 filed on Jun. 22, 2001 now U.S. Pat. No. 6,631,870 and for which priority is claimed under 35 U.S.C. § 120. Application Ser. No. 09/886,384 is the national phase of PCT International Application No. PCT/SE99/02465 filed on Dec. 22, 1999 under 35 U.S.C. § 371. The entire contents of each of the above-identified applications are hereby incorporated by reference. This application also claims priority of Application Nos. 9804495-1 and 9901057-1 filed in Sweden on Dec. 22, 1998 and Mar. 23, 1999, respectively, under 35 U.S.C. § 119.

BACKGROUND OF THE INVENTION

1. Field of the Invention

The present invention generally relates to the field of manufacture and assembly of circuit boards. More specifically, the present invention relates to a method of transferring component tape information to a component mounting machine, a tape guide for guiding a component tape in a component mounting machine, and a tape magazine for receiving the tape guide.

2. Description of Background Art

Generally, within the field of manufacture and assembly of circuit boards, electronic components are fed to a component mounting machine for mechanically and/or electrically mounting the components onto a circuit board. These surface mounted components are often delivered spaced apart along the length of a component tape, which consists of a lower carrier tape provided with compartments, one for each component, and an upper cover, or cover tape or protective tape. After positioning the electronic components in the corresponding compartments, the cover tape is attached to the carrier tape, and the component tape is wound on a component reel. The attachment of the cover tape to the carrier tape can, for instance, be performed by providing either the cover tape or the carrier tape with adhesive areas, or by fusing the cover tape to the carrier tape. Then, the component reel is transferred to a component mounting machine, which is provided with feeding mechanisms for feeding a component to a certain predetermined picking position where it can be picked, or collected, by a pick-up head. Alternatively, the component reel can be transferred to a component tape magazine, which in turn is inserted into the component mounting machine. Then, it is generally the magazine that is equipped with the feeding mechanisms for performing the described feeding of the component tape. WO 86/00778 shows a cassette magazine for a component mounting machine using the above described method.

Generally, a circuit board is provided with a wide variety of different components, and a component mounting machine can be used for the manufacturing of a variety of different circuit boards. Therefore, a substantial number of different types of components are provided to a component mounting machine, wherein each type of component is contained on a separate component tape. The component mounting machine, or the process controlling the machine, must therefore know exactly which type of component can be found at which picking position in the machine. Traditionally, following the loading of a component tape into a component mounting machine or a tape magazine, this is performed by manually entering the position and the type of component of each component tape into memory means used by the machine. This time consuming process must be performed each time a new component tape is loaded into the machine.

Furthermore, when entering the position and component type manually, there is always a considerable risk of entering the wrong type of component or the wrong position. This would inevitably lead to circuit boards being erroneously mounted, or lead to a halt in the manufacturing process until the error has been corrected. In recent years, the use of bar codes has simplified the above-described process. When the component tape has been loaded into its position in a component mounting machine, the position and the type of components are entered by reading both a bar code provided at each tape position in the machine, and a bar code provided on the component tape reel. Still, this process has to be repeated each time a new component tape is entered into the machine, and the risk of reading the bar code for an adjacent, incorrect position in the machine is still there, even though the use of bar codes reduces the risk involved with the above-described process.

When using a tape magazine, a component tape reel is loaded at each of a number of different positions in the magazine. Information regarding the position of the tape reel and the type of components contained on the reel is entered into the machine for each position, along with the magazine identity. Thereby, when switching between two magazines, entering the identity of the new magazine can be sufficient, provided that the positions and type of components of the component tapes have not changed since the magazine were last used. Any change would again require the entering of at least the position and the component type.

It is also preferred if the component mounting machine have knowledge of have many components there are left on the tape in order to optimise the mounting process, and to alert in time that a component tape is about to run out of its components. This information can also be entered manually upon loading a new tape into the machine. Then, the machine could count the number of components that have been picked from the tape and, thereby, derive the number of remaining components on the tape. However, if the component tape is removed from the machine, e.g. when replaced by a type of component needed for a particular circuit board, this information is lost.

According to the method conventionally used within the art, the loading of a component tape in a component mounting machine involves the following steps. Placing the component tape reel into the tape holder of a component mounting machine, or into a tape magazine of a component mounting machine; introducing the free end of the component tape into a feeding mechanism, provided in the machine or in the magazine, such that feeding pins engage corresponding holes provided in the component tape; separating, by hand, the end of the cover tape from the end of the carrier tape for a distance sufficient for the cover tape to be engaged with a cover tape handling means; and lowering a locking mechanism over the carrier tape for holding the carrier tape against the feeding mechanism.

As realised from the above, the loading of a component tape in a component mounting machine and the related entering of component information is a time-consuming process that has to be performed every time a new component has to be added to the circuit board manufacturing process, and every time an empty component tape has to be replaced. The process is also connected with a certain element of risk regarding errors in relation to the more or less manual entering of information. This negatively affects the overall time efficiency of the manufacturing process and, hence, the overall costs.

SUMMARY OF THE INVENTION

A further object of the present invention is to significantly reduce the risk of errors occurring during the entering of component information into the component mounting machine.

A still further object of the present invention is to achieve a higher degree of flexibility related to the loading of component tapes into a component mounting machine.

This and other objects are achieved according to the present invention by providing a method, a tape guide, and a tape magazine having the features defined in the independent claims. Preferred embodiments are defined in the dependent claims.

The present invention is based on the insight of providing a tape guide, for guiding a component tape in a component mounting machine, with the ability to be releasably mounted, such that the loading and/or unloading of a component tape into and from the tape guide can be performed away from the component mounting machine, and with identification means for holding the identity of the tape guide. Preferably, the ability to be releasably mounted is achieved according to the present invention by providing a tape guide with locking means for ready and quick attachment and detachment to interacting locking means in a component mounting machine, or in a tape magazine arranged for insertion into a component mounting machine, and guiding means for guiding a component tape.

By providing a tape guide with the ability to be loaded with a component tape away from a component mounting machine and to be subsequently loaded into the component mounting machine, a facilitated loading of the component tape into the machine, a reduced downtime of the machine, and, thereby, an improved time efficiency of the entire manufacturing process is achieved. This is due to the fact that the time-consuming process of loading the component tape into a component mounting machine, as described above with reference to known art, is reduced to simply placing a component tape reel into the tape holder of a component mounting machine, and mounting a tape guide into the machine. The rest of the loading process is performed beforehand and away from the component mounting machine. Thus, the downtime of the component mounting machine due to the loading of a component tape is limited to the actual time for placing a tape reel into the machine, and for loading a tape guide into the machine, which increases the time efficiency of the machine considerably.

Furthermore, by providing the tape guide with identification means, the tape guide identity can be associated with information regarding the specific component tape that is, or is to be, loaded into the tape guide. Hence, the identity of the tape guide will be the key to the information that is essential to the component mounting machine, namely the type of components carried by the component tape.

According to the invention, the identity of the tape guide is associated with information regarding the component tape that is loaded into the tape guide. As mentioned above, this is performed away from the machine at any time before the attachment of the tape guide into the component mounting machine, or into a tape guide magazine for subsequent insertion into the machine. Thereby, the entering of information does not interfere with the loading of the component tape and the tape guide into the machine.

Preferably, the component tape information is provided in the form of bar codes holding the necessary information. Said bar codes are advantageously applied on the tape reel containing the component tape. Accordingly, the tape guide is preferably provided with a bar code holding the identity of the tape guide. As evident to the man skilled in the art, other forms of information holding means can of course be used without departing from the inventive concept of the present invention. The association of the tape guide identity with the component tape information is performed by simply reading the bar codes with a bar code reader and storing the identity together with the component tape information.

According to an alternative embodiment, the bar codes of the component tape, which can be one or a number of bar codes, are read by a bar code reader and associated with an identity of the tape reel. A bar code can then be produced, relating only to the identity of the component tape or tape reel. Thus, when loading the component tape into a tape guide, only the identity of the component tape or tape reel has to be associated with the tape guide identity, due to the fact that the identity is associated with the component tape information.

According to the invention, the component tape information comprises information regarding which type of components that is provided on the tape. Preferably, the information also contains the number of components provided on the tape. However, there is more information regarding the component tape that can be useful for the component mounting process. These data could for instance include component tape identity, batch number, intended customer, manufacturer of the component tape or of the component, the width of the tape, the pitch of the tape, characteristics of the components on the tape, etc. The characteristics of the components could include resistance, manufacturing tolerances, etc.

According to the invention, the essential information regarding the tape guide is the tape guide identity. However, this could preferably be associated with characteristics of the tape guide, e.g. width of tapes that can be loaded into the tape guide, type of exposure means, batch number, etc.

As described earlier, the tape guide is provided with the ability to be quickly and readily attached and detached into and from the component mounting machine, or a tape guide magazine. According to the preferred embodiment of the invention, means holding information of the identity of the tape guide is automatically connected to means provided in the machine, or in the magazine, for receiving that information, when the tape guide has been mounted into the machine, or the magazine. This is preferably performed by providing the tape guide with identification means in the form of a circuit holding the identity of the tape guide. Said circuit can for instance be provided with contact surfaces, which automatically are connected to corresponding contact pins coupled to identity reading means in the component mounting machine or in the magazine, whereby the identity of the tape guide is read by the machine or the magazine. Said connection could also be an optical connection, or any other suitable connection as realised by the man skilled in the art.

This means that the machine not only receives information regarding the identity of the tape guide that has been mounted into the machine, but also has access to all information associated to the identity of the tape guide. Furthermore, the machine can sense into which position in the machine the tape guide has been mounted. Thereby, there is no need for entering the position of the tape guide into the machine, which means that the risk of entering the wrong position is eliminated. Furthermore, there will never be any risk of mounting a tape guide into the wrong position of the machine, and, when replacing several tape guides, the position into which the new tape guides are mounted are unimportant. This increases the flexibility of the mounting of tape guides into the machine and considerably reduces the risk of making mistakes upon mounting of tape guides. Thus, the replacement and entering of component tapes into a machine can be more speedily performed and the downtime of the machine can be reduced.

When using a tape guide magazine, the position and identity of each tape guide mounted in the magazine are read by the tape guide magazine. This information, i.e. the tape guide identity for each position in the magazine, is then transferred to the component mounting machine when the magazine has been inserted into the machine. Alternatively, the information is relayed directly to the component mounting machine, via a connection provided in the magazine, without actually being read by the magazine. Further, information regarding the identity of the tape guide magazine can be added to the transferred information. This can be performed by any suitable means for transferring information, as realised by the man skilled in the art, and will therefore not be further described.

The required features of the tape guide for enabling the loading of a component tape away from the machine and the subsequent loading of the tape guide, with the component tape, into the machine comprise locking means for ready and quick attachment and detachment of the tape guide into and from the machine, and guiding means for correctly guiding the component tape into the machine.

The locking means is provided for ready, quick and accurate mounting of the tape guide into the component mounting machine. The locking means of the tape guide is arranged for interaction with corresponding locking means provided on the component mounting machine, thus providing both a correct positioning and a secure mounting of the tape guide. Preferably, the locking means is in the form of resiliently biased snap-in locking means, e.g. in the form of a latch and a recess provided on the tape guide interacting with axles provided on the component mounting machine, or in the form of a catch and an axle, respectively, provided on the component mounting machine interacting with corresponding protrusion and recess provided on the tape guide. As realised by a person skilled in the art, various types of snap-in locking means, or other sorts of quick couplings, can be used for ready and quick attachment and detachment of the tape guide into and from a component mounting machine.

The guiding means is provided for guiding the component tape to the correct position within the component mounting machine, such that the components to be picked by a pick-up head reaches the correct picking position. The guiding means is preferably in the form of opposing grooves extending from the distal end of the tape guide to the proximal end thereof.

According to a preferred embodiment of the present invention, the tape guide is provided with component tape retaining means for retaining the component tape such that the component tape is not accidentally displaced relative the tape guide, i.e. such that the tape guide can not move along the length of the component tape when the component tape has been loaded into the tape guide and before attachment of the tape guide into, or after detachment of the tape guide from, the component mounting machine, i.e. when the tape guide with the component tape is located away from the component machine.

Thereby, following loading of the component tape into the tape guide, and the related association of the component tape information to the identity of the tape guide, the tape guide is prevented from being accidentally removed from, or accidentally moved along the length of, the component tape. Thereby, the component tape, contained on a component tape reel, can be stored together with and attached to the tape guide. It also ensures that the tape guide, following association of the tape guide identity to the component tape information, is loaded with the very component tape who's information has been associated with the identity of said tape guide. A further advantage is that the number of components remaining on the tape, as derived by the component mounting machine in the manner described earlier, can be stored and retrieved by the machine when the component tape is re-loaded. This information can of course be retrieved by any component mounting machine having access to the same information.

As mentioned above, the retaining means preferably prevents the component tape from being accidentally moved along the length of the tape guide. This ensures that when loading the component tape into the tape guide, the desired position of the component tape relative the component mounting machine, and its parts, can be chosen. The chosen position is then maintained until the component tape is deliberately released from the tape guide.

According to an embodiment of the invention, the tape guide is also provided with means for exposing a component to be picked at a picking position. This exposure means comprises separating means for separating and lifting a lateral portion of the cover from the component tape, leaving the remaining portion of the cover at least partially attached to the component tape, and for bringing the lifted portion of the cover aside such that the component to be picked can be exposed.

The use of such separating means eliminates the need for means handling the cover tape after removal from the component tape since the cover remains attached to the component tape. Thereby, the loading process is even further facilitated and the loading time is reduced, reducing the downtime of the mounting machine and positively effecting the efficiency of the entire manufacturing process.

After the component tape has been loaded into the tape guide, the tape guide can be connected to the tape reel, according to an embodiment of the invention, by arranging holding means on the tape guide for attachment of the tape guide to a tape reel. Thereby, the component tape reel can not be unrolled, and the tape reel can easily be stored together with the tape guide for quick mounting into a component mounting machine. According to an embodiment of the invention, the holding means comprises a clip for attachment of the tape guide to a tape reel. According to an alternative embodiment, the holding means comprises a piece of Velcro® on the tape guide engaging a corresponding piece of Velcro® provided on the tape reel. As realised by a person skilled in the art, various types of holding means are contemplated without extending beyond the scope of the present invention.

According to an embodiment of the present invention, the body of the tape guide is formed by an elongated open-ended profile with opposing elongated walls, and a base connecting said elongated walls. The walls are provided with the above described guiding means for guiding the component tape. The base is provided with an opening for receiving feeding means, provided in the component mounting machine or in a tape magazine arranged for insertion into the machine, for engagement with the component tape by protrusion through the opening and engagement with feeding holes provided on the component tape. Thus, the tape guide does not comprise any feeding mechanisms at all, which significantly reduces the manufacturing costs for the tape guide. It also reduces the size and weight of the tape guide, and facilitates the storing of the tape guide together with and attached to a component tape contained on a tape reel.

According to an aspect of the present invention, a tape magazine is provided for reception of at least one tape guide according to the invention, the magazine being provided with the corresponding locking means interacting with the locking means provided on the tape guide, said corresponding locking means otherwise being provided in the component mounting machine, as described above. The tape magazine is further provided with means for receiving at least one tape reel provided with a component tape, such that said reception can be performed when the component tape of the tape reel is loaded into the tape guide, and feeding means for feeding the component tape(s) towards the picking position. As described earlier, the magazine is also provided with means for receiving the identities of tape guides that are mounted into the magazine, along with means for transferring this information to a component mounting machine. The tape magazine is inserted to, or mounted or attached to, the component mounting machine and forms an intermediate device between the tape guide, with the loaded component tape and tape reel, and the component mounting machine, and feeds the components to their respective picking position within the machine.

In the above and following description of the present invention, for the purposes of storing information, associating information, retrieving information, etc., as described above, use is made of at least one database, to which the component mounting machine(s) have access. However, since any suitable database can be used with the invention, as realised by the man skilled in the art, the specifics of the database do not form part of the invention and will therefore not be further described.

Further details and aspects of the invention will become apparent from the following detailed description of embodiments of the invention, reference being made to the accompanying drawings, wherein like reference numerals refer to similar parts throughout.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 1:
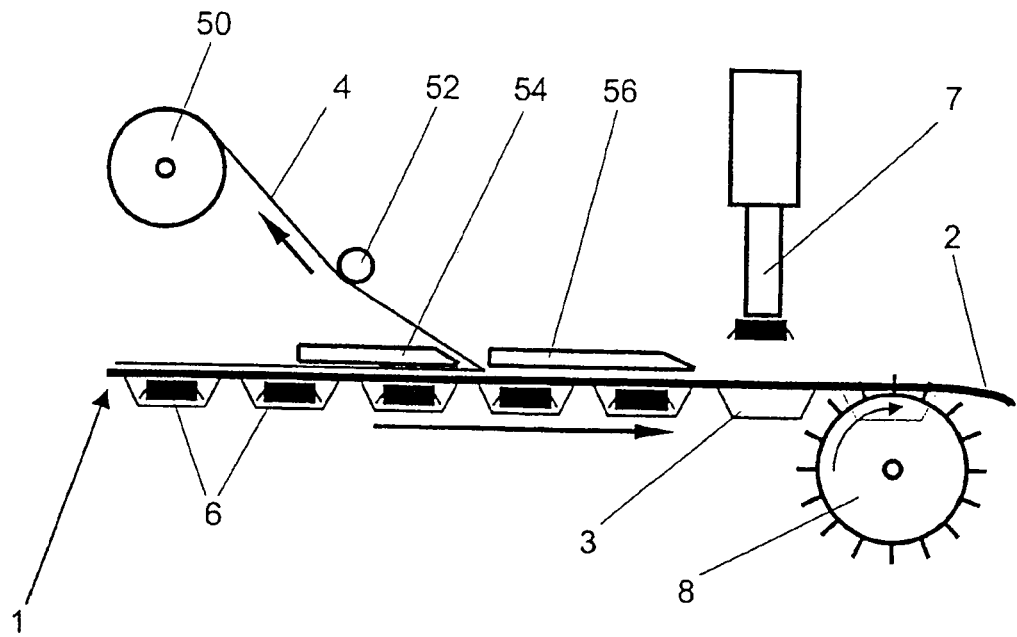
FIG. 1 is a schematic side view illustrating the principle of loading a component tape in a component mounting machine according to the state of the art.

With reference to FIG. 1, there is shown in schematic form a component tape and parts of a component mounting machine according to the state of the art. A component tape 1, comprising a carrier tape 2, provided with compartments 3 filled with components 6, and a cover tape 4, is introduced into a feeding mechanism 8. The pins of the feeding mechanism 8 engage corresponding holes 5 provided in the carrier tape 2. The end of the cover tape 4 is removed from the carrier tape 2 and wound onto a winding hub 50, which is provided with a separate feeding mechanism (not shown). The cover tape 4 is brought past a first plate 54 provided with a stripping edge, and the cover tape 4 is stretched by a separate reel 52, applying pressure on the cover tape 4. A second plate 56 is provided after the first plate 54 for preventing small components 6, that can be electrostatically adhered to the cover tape 4, from sticking to and following the removed portion of the cover tape 4 when said portion is fed away. The second plate 56 extends to a position where the components 6 are picked by a pick-up head 7.

Figure 2:
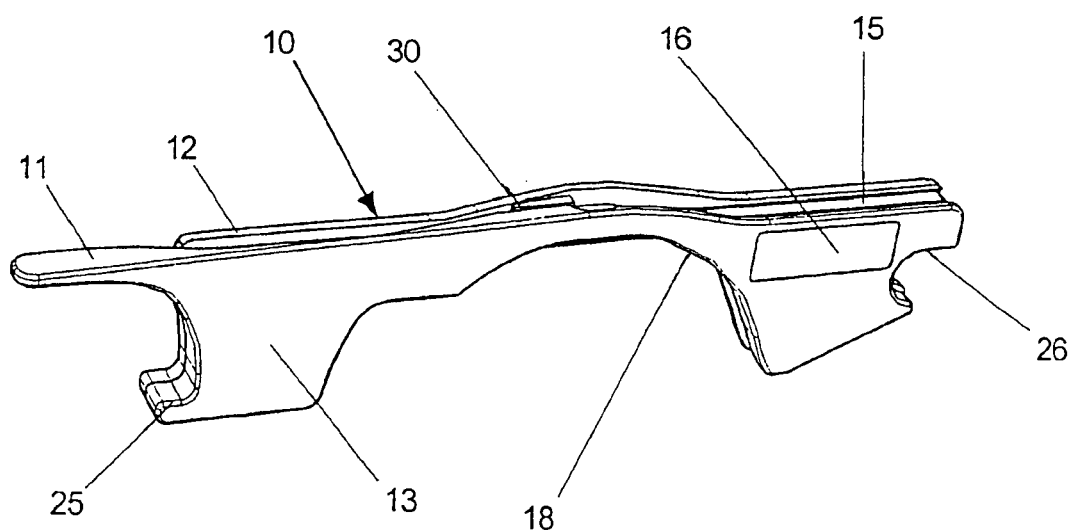
FIG. 2 is a perspective view illustrating the tape guide according to a preferred embodiment of the invention.
Figure 3:
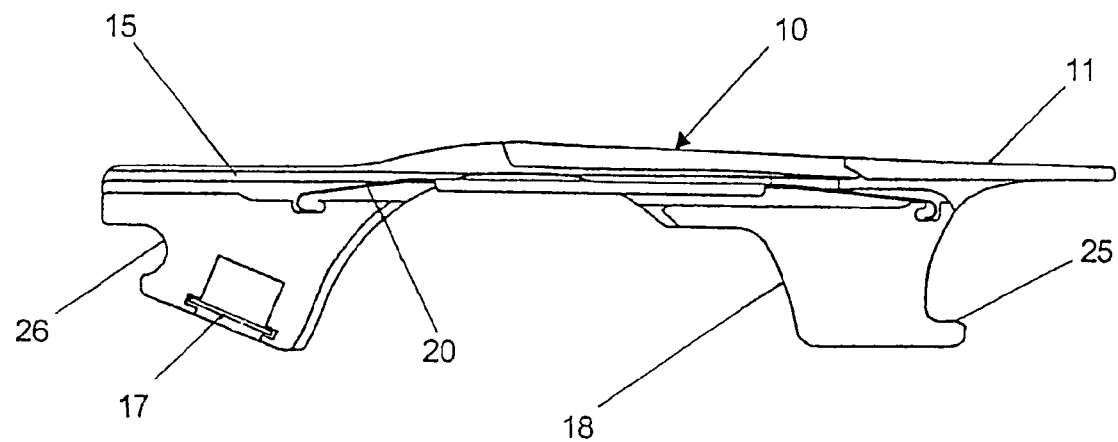
FIG. 3 is a cross sectional view of the tape guide of FIG. 2.
Figure 4:
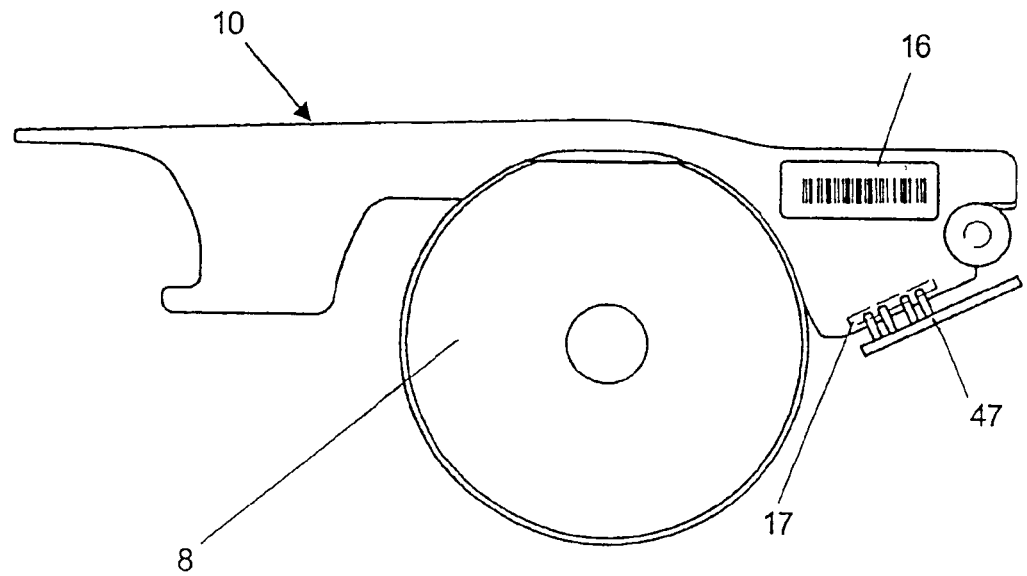
FIG. 4 is a cross sectional view of the tape guide of FIG. 2 when connected to a tape guide magazine or a component mounting machine.

Referring to FIGS. 2–4, preferred embodiments of a tape guide according to the present invention are illustrated. The tape guide 10 comprises an elongated open-ended profile with opposing elongated walls 12, 13 and a base (not shown) connecting the elongated walls 12, 13. The walls 12, 13 are provided with grooves 15, for facilitating insertion of a component tape 1 and for guiding the component tape 1. The base is provided with an opening 18 for enabling the pins of a feeding device 8, as shown in FIG. 4, provided in the component mounting machine or in a tape magazine attached to the machine, to engage the holes 5 of the carrier tape 2.

The tape guide 10 is removably mounted to a component mounting machine, or a tape magazine, and can be removed together with the component tape 1 when unloading the component tape 1 from the component mounting machine. Therefore, the tape guide 10 is provided with a handle 11 for facilitating the attachment and detachment of the tape guide into and from the component mounting machine. Further, the tape guide 10 is provided with locking means 25, 26 for enabling ready attachment and detachment of the tape guide 10 to the component mounting machine. The locking means 25, 26 will be described below when referring to FIGS. 7a and 7b.

According to the invention, the tape guide comprises first identification means 16, preferably in the form of a bar code provided on an adhesive label. The bar code 16 contains information regarding the identity of the tape guide 10.

According to the most preferred embodiment of the invention, the tape guide also comprises second identification means 17 in the form of an identification circuit. The identification circuit 17 holds the same information regarding the identity of the tape guide 10 as the bar code 16. The circuit 17 is provided with contact surfaces for connection to contact pins provided on an identity receiving or reading circuit 47. The identity receiving circuit 47 is located in a tape guide magazine 40 or in a component mounting machine. The connection between the identification circuit 17 and the identity receiving circuit 47 is accomplished when mounting the tape guide 10 into the magazine 40 or the component mounting machine.

Using the method according to the invention, component tape information is provided on the component tape reel 9 in the form of bar codes. The number of bar codes can vary from tape to tape, depending on the information contained. When loading the component tape 1 into a tape guide 10, the bar codes on the tape are read by a bar code reader. Then, the identity of the tape guide 10, also provided on a bar code 16, is read in the same manner. The identity of the tape guide 10 is then associated with the information of the component tape 1 and stored in a database. The component tape reel 9 can now be stored together with the tape guide 10 or be mounted in a tape magazine 40 or a component mounting machine.

For ease of description, there will now be described the method according to the invention when mounting the tape guide 10 into a tape guide magazine 40. However, the tape guide 10 could be directly mounted into a component mounting machine.

Following mounting of the tape guide 10 into a tape magazine 40, the position of the tape guide 10 in the magazine 40 is detected and the identity of the tape guide 10 is received by the identity receiving means 47. Since a tape guide magazine 40 generally is arranged for the reception of a number of tape guides at different positions in the magazine, the magazine can be loaded with tape guides away from the component mounting machine. When inserting the magazine into the component mounting machine, means for transferring information between the tape guide magazine and the component mounting machine are automatically connected.

The transferred information comprises the identity of each tape guide 10 along with the position in the tape guide magazine 40 where each tape guide 10 is positioned. The component mounting machine can then retrieve all information that is associated with the tape guide identity, i.e. both the component tape information and any tape guide information available. This information is retrieved from the above-mentioned database, to which the component mounting machine has access.

When picking components from the component tapes and mounting them on a circuit board, each picked component is counted by the component mounting machine, which relays this information to the database, either continuously, at specific intervals, or when the tape guide containing the component tape is removed from the component mounting machine. Thus, the database can hold updated information regarding the number of components contained on each component tape that has been loaded into a tape guide. Other information relating to the component tape that can be registered by the component mounting machine, and relayed to the database, could include number of faulty components, number of misplaced components, etc.

In the embodiment shown in the figures, the tape guide 10 is provided with component tape retaining means 20 for preventing accidental displacement of the component tape 1 along the tape guide 10. Said retaining means 20 are provided in order to prevent the component tape 1 from being accidentally separated from the tape guide 10, when the tape guide 10 and the component tape 1 is not attached to a component mounting machine, or a tape magazine. According to a preferred embodiment of the invention, the retaining means comprises a flexible support spring 20 and a counter support, preferably in the form of a separating means 30 (described below in connection with FIG. 5), for insertion of a component tape therebetween. The support spring 21 exerts a pressure on the component tape 1, pressing the carrier tape against the counter support. Thereby, due to the friction between the component tape 1 and the retaining means 20, the component tape 1 is prevented from being accidentally displaced along the length of the tape guide 10, which means that the component tape 1 and the tape guide 10 remains attached when the tape guide 10 is detached from the component mounting machine. However, the friction power is insufficient to interfere with the feeding action provided by the feeding means. The support spring 20 also stabilises the component tape 1, such that vibrations are greatly reduced.

Figure 5:
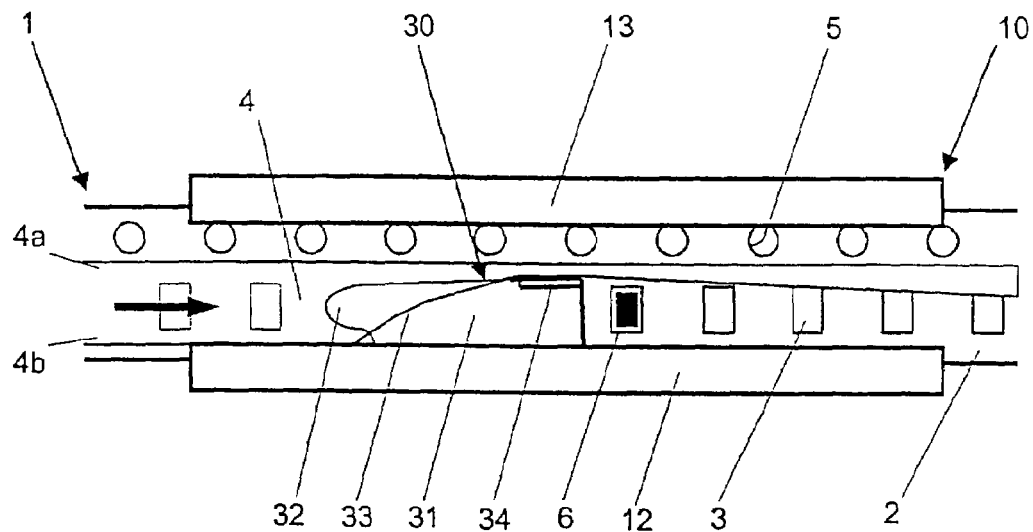
FIG. 5 is a top view illustration the tape guide according to an embodiment of the invention.

Referring now to FIG. 5, there is shown a particular embodiment of the present invention. According to this embodiment, the tape guide is provided with separating means 30 for separating and lifting a lateral portion of the cover tape 4 from the carrier tape 2. The separating means 30 comprises a first section 31 and a second section 34, the first section 31 comprising a tip portion 32, positioned at the distal end of the separating means 30, and a body portion 33. The tip portion 32 extends distally from the body portion 33, has a laterally and vertically rounded shape, and has an increased thickness in the direction extending backwards from the distal end of the tip portion 32.

The body portion 33 is elongated and has an extension in the proximal direction. Thus, the body portion 33 forms a cover plate preventing the exposure of each component 6 until said component 6 reaches the picking position. This will ensure that the components 6 can not escape from their respective compartments 3. Furthermore, the first section 31 prevents small components, which might be electrostatically adhered to the cover tape 4, from sticking to and following the lifted portion of the cover tape 4.

The second section 34 is provided on the body portion 33 of the first section 31, and extends vertically from, and essentially perpendicular to, the first section 31. The separating means 30, according to this embodiment, is particularly well suited for cover tapes that are provided with adhesive, or fused, areas 4a, 4b along the sides of the cover tape 4, as can be seen in FIG. 5. The separating means 30 is supported by the tape guide 10 that ensures that the carrier tape 2 is properly positioned relative the separating means 30 and the pick-up head 7.

When feeding the carrier tape 2 in the feeding direction, as shown by the arrow in FIG. 2, the tip portion 32 separates and lifts the cover tape 4, at the lateral centre of the cover tape 4, from the carrier tape 2. The lateral extension of the body portion 33 to one side ensures that the corresponding side 4b of the cover tape 4 is separated from the carrier tape 2. The adhesive area 4a provided on the other side of the cover tape 4 is not affected by the separating means 30 and keeps that side of the cover tape 4 attached to the carrier tape 2. Following the separation of a portion of the cover tape 4 from the carrier tape 2, this portion is brought to an upright position, at least at the picking position, by the second section 34. Thereby, the components 6 are completely exposed at the picking position.

Figure 6:
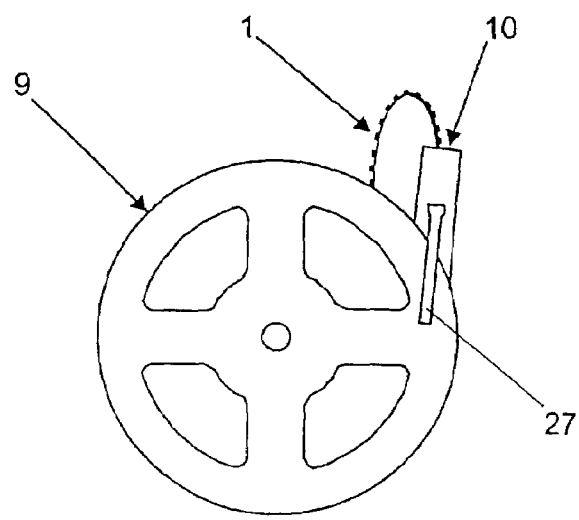
FIG. 6 is a schematic view of a tape reel and the tape guide according to an embodiment of the invention.

According to an embodiment of the present invention, the tape guide 10 is provided with holding means for attaching the tape guide 10 to the tape reel 9. An example of this is shown in FIG. 6. Here the tape guide 10 is provided with a clip 27 that ensures that the tape guide 10 is not accidentally separated from the tape reel 9 after the component tape 1 has been loaded into the tape guide 10. Thereby, the tape reel 9 can not be unrolled, and the tape reel 9 can easily be stored together with the tape guide 10 for quick mounting into a component mounting machine. In an alternative embodiment the holding means is a piece of Velcro® (not shown) for engagement with a corresponding piece of Velcro® provided on the tape reel.

Figure 7A:
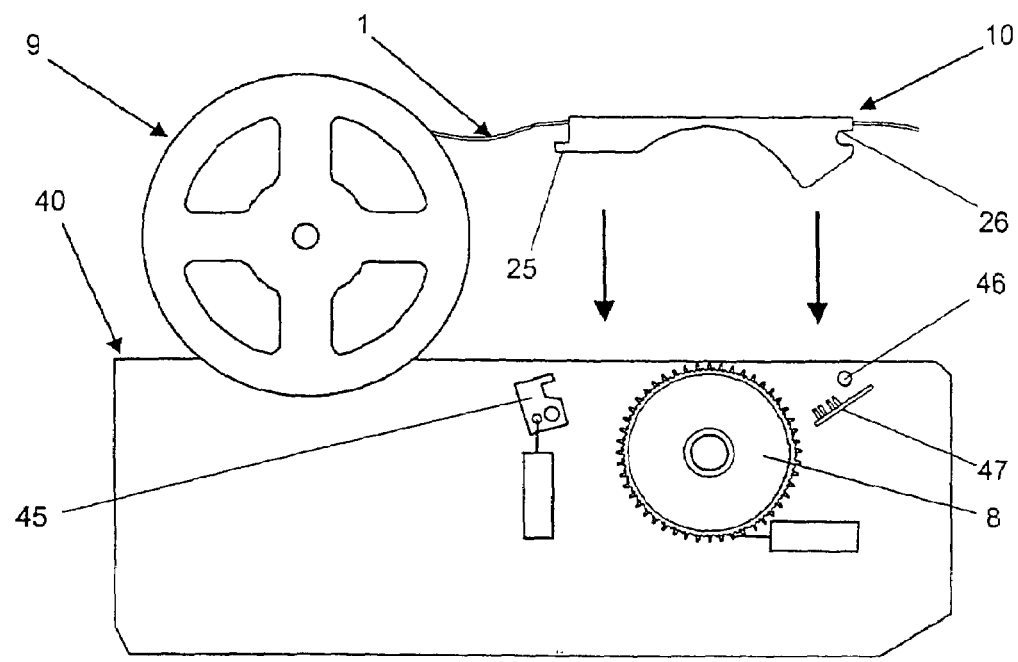
FIGS. 7a and 7b are schematic side views illustrating the mounting of a tape guide according to an embodiment of the invention in a tape guide magazine or a component mounting machine.
Figure 7B:
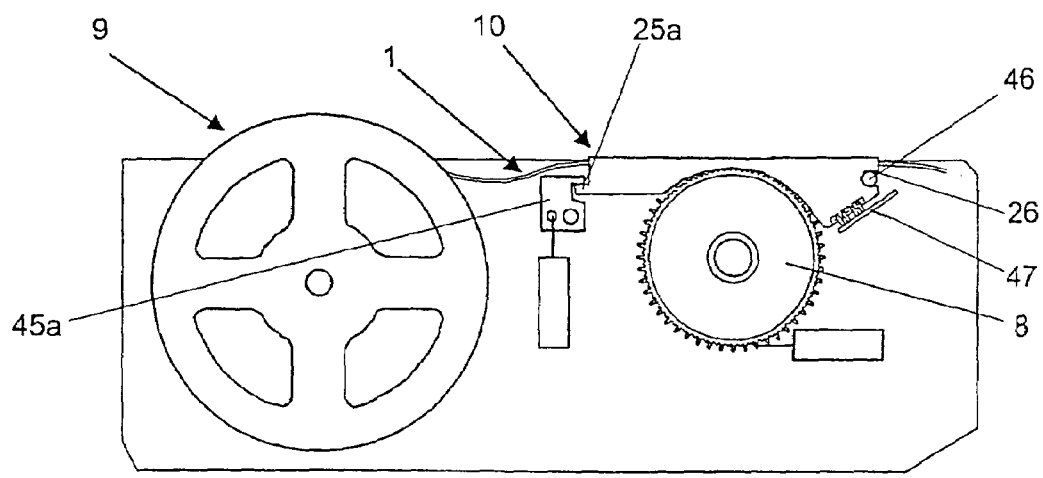

Referring to FIGS. 7a and 7b, there is schematically shown an example illustrating the quick and ready attachment of a tape guide 10 into a magazine 40 of a component mounting machine, and the simultaneous connection of the second identification means 17 to the identity receiving means 47. In the figures, a tape reel 9 provided with a component tape 1 has already been loaded into the tape guide 10. The tape guide 10 is provided with locking elements in the form of a protrusion 25 and a recess 26 provided at opposite ends of the elongated tape guide 10. These locking elements interact with corresponding locking elements 45, 46 in the form of a catch lock 45 and an axle 46 provided in the tape magazine 40. When loading the tape guide 10 into the magazine 40 the recess 26 first engages the axle 46, then the tape guide 10 is pivoted around the axle 46 such that the catch lock 45 goes into engagement with the protrusion 25. At the same time, the identification circuit 17 (as shown in FIG. 4) contacts the contact pins of the identity receiving circuit 47. FIG. 7b shows the tape reel 9, the tape guide 10 and the tape magazine 40 after the tape guide 10 has been loaded into the magazine 40. For removal of the tape guide 10 from the tape magazine 40, the catch lock 45 has to be released.

As apparent from this specification, the tape guide according to the invention can be directly mounted into a component mounting machine, or mounted into a tape magazine, either when the tape magazine already has been inserted into a component mounting machine or before loading of the tape magazine into a component mounting machine.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of transferring component tape information to a component mounting machine, the method comprising the steps of:
    loading a component tape into a tape guide, the component tape being provided with tape information means associated with component tape information and the tape guide comprising first identification means associated with tape guide information;
    associating the identity of the tape guide with the information of the component tape;
    mounting said tape guide into a component mounting machine; and
    transferring information regarding the tape guide identity, associated with said component tape information and said tape guide information, from the tape guide to the component mounting machine by connecting second identification means provided in the tape guide, said second identification means holding information of the identity of the tape guide, to corresponding identity detecting means provided in the component mounting machine.

2. The method according to claim 1, wherein said second identifier is an identification circuit, and said corresponding identity detector is an identity receiving circuit.

3. The method according to claim 1, wherein said step of transferring information is automatically accomplished when the tape guide has been mounted into the component mounting machine.

4. The method according to claim 1, further comprising the step of sensing, following the mounting of the tape guide into the machine, the position in the machine at which the tape guide has been mounted.

5. The method according to claim 1, wherein said step of associating comprises the steps of:
    reading the information of the component tape and the identity of the tape guide; and
    storing the information of the component tape together with the identity of the tape guide.

6. The method according to claim 5, wherein the step of reading the identity of the tape guide and the information of the component tape comprises the step of reading a bar code provided on the tape guide and a bar code provided on the component tape.

7. The method according to claim 5, wherein the step of reading the identity of the tape guide and the information of the component tape comprises the step of reading a bar code provided on the tape guide and a bar code provided on a tape reel containing the component tape.

8. The method according to claim 1, comprising the step of retrieving component tape and tape guide information associated with the tape guide identity with the component mounting machine.

9. The method according to claim 1, wherein the component tape information comprises at least the type of components that are provided on the component tape.

10. The method according to claim 9, wherein the component tape information further comprises at least one of the group consisting of component tape identity, number of remaining components on the tape, batch number, intended customer, component tape manufacturer, tape width, pitch of the tape, and component characteristics.

11. The method according to claim 1, wherein the tape guide information comprises the identity of the tape guide.

12. The method according to claim 11, wherein the tape guide information comprises at least one of the group consisting of the tape guide width, the width of tapes that can be received, type of exposure means, and batch number.

13. The method according to claim 1, wherein the component mounting machine comprises feeding means for feeding the component tape towards a picking position.

14. A method of transferring component tape information to a component mounting machine, the method comprising the steps of:
    loading a component tape into a tape guide, the component tape being provided with tape information means associated with component tape information and the tape guide comprising first identification means associated with tape guide information;
    associating the information of the tape guide with the identity of the component tape;
    mounting said tape guide into a tape guide magazine, wherein the magazine is arranged for the reception of a plurality of tape guides;
    inserting the tape guide magazine into a component mounting machine, the machine being arranged for the reception of at least one magazine;
    transferring information regarding the tape guide identity from the tape guide to the component mounting machine by connecting second identification means provided in the tape guide, mid second identification means holding information of the identity of the tape guide, to corresponding identity detecting means, the component mounting machine thereby holding information on the identity and position of the tape guide and said associated component tape and tape guide information.

15. The method according to claim 14, wherein said second identifier is an identification circuit.

16. The method according to claim 14, wherein said identity detecting means is an identity receiving circuit is provided in the component mounting machine.

17. The method according to claim 14, wherein the magazine comprises feeding means for feeding the component tape towards a picking position.

18. The method according to claim 14, wherein said step of associating comprises the steps of:
reading the information of the component tape and the identity of the tape guide; and
storing the information of the component tape together with the identity of the tape guide.

19. The method according to claim 18, wherein the step of reading the identity of the tape guide and the information of the component tape comprises the step of reading a bar code provided on the tape guide and a bar code provided on the component tape.

20. The method according to claim 18, wherein the step of reading the identity of the tape guide and the information of the component tape comprises the step of reading a bar code provided on the tape guide and a bar code provided on a tape reel containing the component tape.

21. The method according to claim 14, comprising the step of retrieving component tape and tape guide information associated with the tape guide identity with the component mounting machine.

22. The method according to claim 14, wherein the component tape information comprises at least the type of components that are provided on the component tape.

23. The method according to claim 22, wherein the component tape information further comprises at least one of the group consisting of component tape identity, number of remaining components on the tape, batch number, intended customer, component tape manufacturer, tape width, pitch of the tape, and component characteristics.

24. The method according to claim 14, wherein the tape guide information comprises the identity of the tape guide.

25. The method according to claim 24, wherein the tape guide information comprises at least one of the group consisting of the tape guide width, the width of tapes that can be received, type of exposure means, and batch number.

26. The method according to claim 14, wherein the information regarding the tape guide identity is transferred from the tape guide to the component mounting machine via the magazine.

27. The method according to claim 26, further comprising the steps of:
sensing the position in the magazine into which the tape guide has been mounted;
transferring information regarding tape guide identity, associated with component tape information, from the tape guide to the magazine by connecting said second identification means to said identity detecting means, preferably an identity receiving circuit, provided in the magazine;
sensing, when the machine is arranged for receiving several magazines, the position in the machine into which the magazine has been inserted; and
transferring for each position in the magazine information regarding the tape guide identity from the magazine to the component mounting machine, the component mounting machine thereby holding information on the identity and position of each tape guide and said associated component tape and tape guide information.

28. A method of transferring component tape information to a component mounting machine, the method comprising the steps of:
loading a component tape into a tape guide, the component tape being provided with a tape information carrier associated with component tape information and the tape guide comprising a first identifier associated with tape guide information;
associating the identity of the tape guide with the information of the component tape;
mounting said tape guide into a component mounting machine; and
transferring information regarding the tape guide identity, associated with said component tape information and said tape guide information, from the tape guide to the component mounting machine by connecting a second identifier provided in the tape guide, said second identifier holding information of the identity of the tape guide, to a corresponding identity detector provided in the component mounting machine.

29. The method according to claim 28, wherein said second identifier is an identification circuit, and said corresponding identity detector is an identity receiving circuit.

30. The method according to claim 28, wherein said step of transferring information is automatically accomplished when the tape guide has been mounted into the component mounting machine.

31. The method according to claim 28, further comprising the step of sensing, following the mounting of the tape guide into the machine, the position in the machine at which the tape guide has been mounted.

32. The method according to claim 28, wherein said step of associating comprises the steps of:
reading the information of the component tape and the identity of the tape guide; and
storing the information of the component tape together with the identity of the tape guide.

33. The method according to claim 32, wherein the step of reading the identity of the tape guide and the information of the component tape comprises the step of reading a bar code provided on the tape guide and a bar code provided on the component tape.

34. The method according to claim 32, wherein the step of reading the identity of the tape guide and the information of the component tape comprises the step of reading a bar code provided on the tape guide and a bar code provided on a tape reel containing the component tape.

35. The method according to claim 28, further comprising the step of retrieving component tape and tape guide information associated with the tape guide identity with the component mounting machine.

36. The method according to claim 28, wherein the component tape information comprises at least the type of components that are provided on the component tape.

37. The method according to claim 36, wherein the component tape information further comprises at least one of the group consisting of component tape identity, number of remaining components on the tape, batch number, intended customer, component tape manufacturer, tape width, pitch of the tape, and component characteristics.

38. The method according to claim 28, wherein the tape guide information comprises the identity of the tape guide.

39. The method according to claim 38, wherein the tape guide information comprises at least one of the group consisting of the tape guide width, the width of tapes that can be received, a type of exposure mechanism, and batch number.

40. The method according to claim 28, wherein the component mounting machine comprises a feeding mechanism for feeding the component tape towards a picking position.

41. A method of transferring component tape information to a component mounting machine, the method comprising the steps of:
- loading a component tape into a tape guide, the component tape being provided with a tape information carrier associated with component tape information and the tape guide comprising a first identifier associated with tape guide information;
- associating the information of the tape guide with the identity of the component tape;
- mounting said tape guide into a tape guide magazine, wherein the magazine is arranged for the reception of a plurality of tape guides;
- inserting the tape guide magazine into a component mounting machine, the machine being arranged for the reception of at least one magazine;
- transferring information regarding the tape guide identity from the tape guide to the component mounting machine by connecting a second identifier provided in the tape guide, said second identifier holding information of the identity of the tape guide, to a corresponding identity detector, the component mounting machine thereby holding information on the identity and position of the tape guide and said associated component tape and tape guide information.

42. The method according to claim 41, wherein said second identifier is an identification circuit.

43. The method according to claim 41, wherein said identity detector is an identity receiving circuit provided in the component mounting machine.

44. The method according to claim 41, wherein the magazine comprises a feeding mechanism for feeding the component tape towards a picking position.

45. The method according to claim 41, wherein said step of associating comprises the steps of:
- reading the information of the component tape and the identity of the tape guide; and
- storing the information of the component tape together with the identity of the tape guide.

46. The method according to claim 45, wherein the step of reading the identity of the tape guide and the information of the component tape comprises the step of reading a bar code provided on the tape guide and a bar code provided on the component tape.

47. The method according to claim 45, wherein the step of reading the identity of the tape guide and the information of the component tape comprises the step of reading a bar code provided on the tape guide and a bar code provided on a tape reel containing the component tape.

48. The method according to claim 41, comprising the step of retrieving component tape and tape guide information associated with the tape guide identity with the component mounting machine.

49. The method according to claim 41, wherein the component tape information comprises at least the type of components that are provided on the component tape.

50. The method according to claim 49, wherein the component tape information further comprises at least one of the group consisting of component tape identity, number of remaining components on the tape, batch number, intended customer, component tape manufacturer, tape width, pitch of the tape, and component characteristics.

51. The method according to claim 41, wherein the tape guide information comprises the identity of the tape guide.

52. The method according to claim 51, wherein the tape guide information comprises at least one of the group consisting of the tape guide width, the width of tapes that can be received, a type of exposure mechanism, and batch number.

53. The method according to claim 41, wherein the information regarding the tape guide identity is transferred from the tape guide to the component mounting machine via the magazine.

54. The method according to claim 53, further comprising the steps of:
- sensing the position in the magazine into which the tape guide has been mounted;
- transferring information regarding tape guide identity, associated with component tape information, from the tape guide to the magazine by connecting said second identifier to said identity detector provided in the magazine;
- sensing, when the machine is arranged for receiving several magazines, the position in the machine into which the magazine has been inserted; and
- transferring for each position in the magazine information regarding the tape guide identity from the magazine to the component mounting machine, the component mounting machine thereby holding information on the identity and position of each tape guide and said associated component tape and tape guide information.

* * * * *